(12) United States Patent
Do et al.

(10) Patent No.: US 8,143,670 B2
(45) Date of Patent: Mar. 27, 2012

(54) SELF ALIGNED FIELD EFFECT TRANSISTOR STRUCTURE

(75) Inventors: Lee-Mi Do, Dajeon (KR); Kyu-Ha Baek, Dajeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 29 days.

(21) Appl. No.: 12/619,116

(22) Filed: Nov. 16, 2009

(65) Prior Publication Data

US 2010/0155793 A1    Jun. 24, 2010

(30) Foreign Application Priority Data

Dec. 23, 2008    (KR) .................. 10-2008-0131869

(51) Int. Cl.
*H01L 29/76* (2006.01)

(52) U.S. Cl. ............... 257/332; 257/346; 257/E29.318; 257/E21.655; 438/229; 438/299

(58) Field of Classification Search .............. 438/229, 438/299; 257/288, 332, 346, E21.655, E29.318, 257/E29.32, E29.321
See application file for complete search history.

(56) References Cited

U.S. PATENT DOCUMENTS

| 4,694,564 | A |   | 9/1987  | Enoki et al.              |
| 6,107,662 | A | * | 8/2000  | Kim ..................... 257/330 |
| 6,825,528 | B2| * | 11/2004 | Iwata et al. ............. 257/336 |
| 7,419,858 | B2| * | 9/2008  | Schuele et al. ........... 438/163 |
| 7,704,806 | B2| * | 4/2010  | Chae et al. .............. 438/149 |
| 7,872,309 | B2| * | 1/2011  | Schuele et al. ........... 257/344 |
| 2008/0246088 | A1 |   | 10/2008 | Schuele et al.         |
| 2008/0258147 | A1 |   | 10/2008 | Zhang et al.           |
| 2009/0026970 | A1 |   | 1/2009  | Ohtani                 |

FOREIGN PATENT DOCUMENTS

| KR |     0271034 B  | 3/2000  |
| KR | 10-2002-0064986 | 8/2002  |
| KR |  2004-0099568 A | 12/2004 |
| KR |  2007-0001426 A | 1/2007  |
| KR |  2008-0002539 A | 1/2008  |

* cited by examiner

*Primary Examiner* — David Vu
*Assistant Examiner* — Brandon Fox
(74) *Attorney, Agent, or Firm* — Rabin & Berdo, P.C.

(57) ABSTRACT

Provided is a self aligned filed effect transistor structure. The self aligned field effect transistor structure includes: an active region on a substrate; a U-shaped gate insulation pattern on the active region; and a gate electrode self-aligned by the gate insulation pattern and disposed in an inner space of the gate insulation pattern.

13 Claims, 12 Drawing Sheets

SELF ALIGNED FIELD EFFECT TRANSISTOR STRUCTURE

CROSS-REFERENCE TO RELATED APPLICATIONS

This U.S. non-provisional patent application claims priority under 35 U.S.C. §119 of Korean Patent Application No. 10-2008-0131869, filed on Dec. 23, 2008, the entire contents of which are hereby incorporated by reference.

BACKGROUND

The present invention disclosed herein relates to a transistor structure, and more particularly, to a self aligned field effect transistor structure having a self aligned gate electrode and source/drain.

Generally, a semiconductor device and a display device may include various kinds of self aligned field effect transistor structures as a switching device. For example, the semiconductor device may use a Complementary Metal Oxide Semiconductor (CMOS) transistor as a switching device. The display device may use a Thin Film Transistor (TFT) as a switching device. Among the TFTs, a TFT where polysilicon is used for an active layer may operate at a high speed because carriers transfer fast. Accordingly, a polysilicon TFT may be used for a CMOS-TFT, an Erasable and Programmable Read Only Memory (EPROM), an Electrically Erasable and Programmable Read Only Memory (EEPROM), and a Random Access Memory (RAM).

SUMMARY

Example embodiments provide a self aligned field effect transistor structure for improving an operation speed.

Example embodiments also provide a self aligned field effect transistor structure having an improved function as a switching device.

Embodiments of the present invention provide self aligned field effect transistor structures including: an active region on a substrate; a U-shaped gate insulation pattern on the active region; and a gate electrode self-aligned by the gate insulation pattern and disposed in an inner space of the gate insulation pattern.

In some embodiments, the gate insulation pattern includes a sidewall and a bottom wall; and a height of the sidewall is higher than a top height of the gate electrode.

In other embodiments, the gate electrode is formed by supplying a conductive material to the inner space through a open top of the U-shaped gate insulation pattern.

In still other embodiments, the self aligned field effect transistor structures further include a source/drain self-aligned by the gate insulation pattern and disposed on the substrate adjacent to the gate insulation pattern.

In even other embodiments, the source/drain is formed by implanting an impurity ion on the substrate.

In yet other embodiments, the source/drain is formed by supplying a conductive material on the substrate.

In further embodiments, the gate electrode and the source/drain are formed of the same conductive material.

In still further embodiments, the gate electrode and the source/drain comprise at least one of Al, Cu, Mo, W, Cr, Pt, Polyaniline (PANI), a conductive polymer such as PEDOT, a Carbon Nano Tube (CNT), Pyrrolidine, and graphite.

In even further embodiments, the substrate includes a glass substrate; and the self aligned field effect transistor structure comprises a switching device of a display device.

In yet further embodiments, a width of the active region is greater than a bottom width of the gate insulation pattern.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF EMBODIMENTS

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 1:
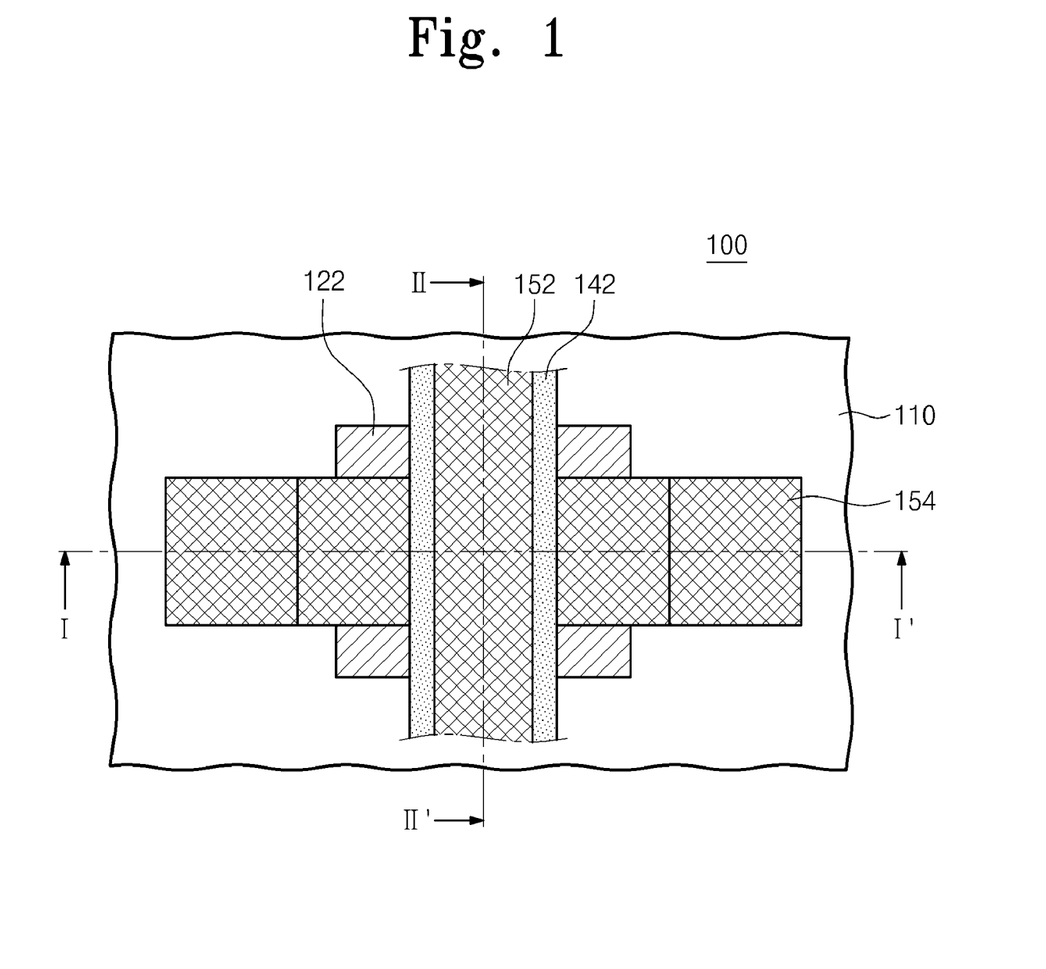
FIG. 1 is a plan view illustrating a self aligned field effect transistor structure according to an embodiment of the present invention.
Figure 2:
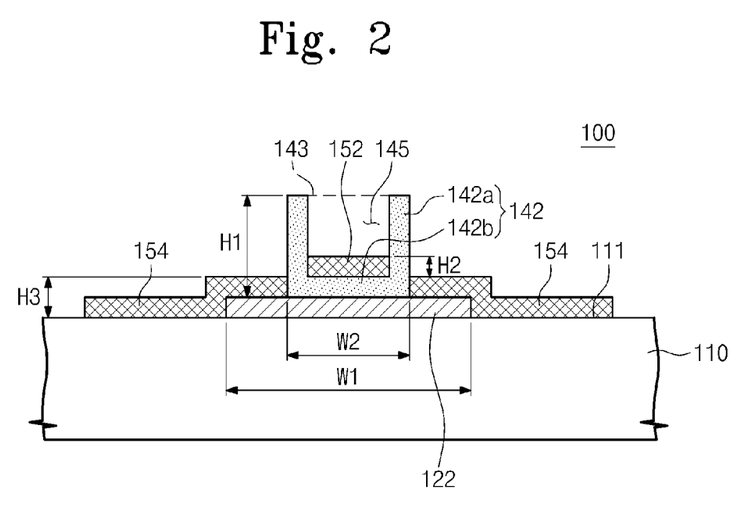
FIG. 2 is a sectional view taken along the line I-I' of FIG. 1.
Figure 3:
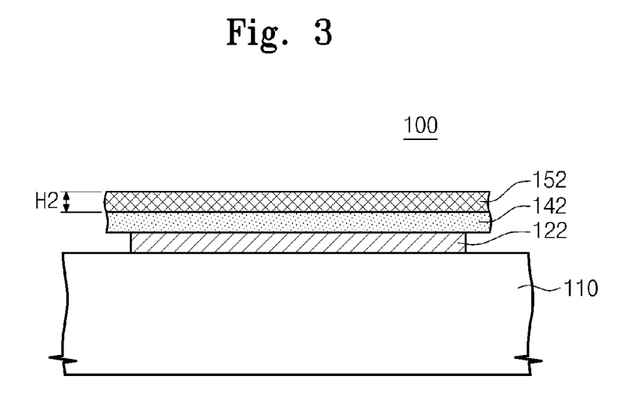
FIG. 3 is a sectional view taken along the line II-II' of FIG. 1.

FIG. 1 is a plan view illustrating a self aligned field effect transistor structure according to an embodiment of the present invention. FIG. 2 is a sectional view taken along the line I-I' of FIG. 1. FIG. 3 is a sectional view taken along the line II-II' of FIG. 1.

Referring to FIGS. 1 through 3, the self aligned field effect transistor structure 100 includes an active region 122 and a gate insulation pattern 142, which are sequentially stacked on a substrate 110. Additionally, the self aligned field effect transistor structure 100 may further include a gate electrode 152 and a source/drain 154.

The substrate 110 may be a base for forming the self aligned field effect transistor structure 100. The substrate 110 may be one of a semiconductor substrate, a transparent substrate, and a plastic substrate. As one example, the substrate 110 may include a glass substrate for manufacturing a display device or a flexible plastic substrate.

The active region 122 may be interposed between the substrate 110 and the gate insulation pattern 142. The width W1 of the active region 122 may be greater than the width W2 of the gate insulation pattern 142. Accordingly, a portion of the top of the active region 122 may not be covered by the gate insulation pattern 142. The active region 122 may include a conductive material used for forming a channel. For example, the active region 122 may include at least one of poly-silicon, μc-silicon, and an organic conductive layer.

The gate insulation pattern 142 may generally have a section of a U-shape. As one example, the gate insulation pattern 142 includes a vertically disposed sidewall 142a and a bottom wall 142b connecting the bottoms of the sidewalls 142a. The sidewall 142a and the bottom wall 142b may have a section of a-U shape with an open top 143. The top height H1 of the sidewall 142a may be higher than that of the gate electrode 152. Accordingly, the gate insulation pattern 142 may have an inner space 145 that is not completely filled by the gate electrode 152. The gate insulation pattern 142 may be formed of an insulating material. For example, the gate insulation pattern 142 may include one of a silicon oxide layer, an organic matter, and an inorganic matter. The organic matter may be one of Polyvinyl Pyrrolidone (PVP), Polymethyl-methacrylate (PMMA), and Hydrogen Silsesquioxane (HSQ).

The gate electrode 152 may be disposed in the inner space 145 of the gate insulation pattern 142. As one example, the side and bottom of the gate electrode 152 may be surrounded by the gate insulation pattern 142. However, the top of the gate electrode 152 may be exposed to the inner space 145.

The source/drain 154 may be disposed adjacent to first walls 142a of the gate electrode 152 at the outside of the gate electrode 152. Furthermore, the source/drain 154 may cover the active region 122 that is not covered by the gate insulation pattern 142. At this point, the top height H3 of the source/drain 154 may be lower than the top height H1 of the gate insulation pattern 142. Accordingly, the gate electrode 152 and the source/drain 154 may be electrically separated by the gate insulation pattern 142.

In addition, the gate electrode 152 and the source/drain 154 are self-aligned by the gate insulation pattern 142. For example, since a conductive material is applied to the front surface 111 of the substrate 110 having the gate insulation pattern 142, the gate electrode 152 and the source/drain 154 may be self-aligned by the gate insulation pattern 142. Accordingly, the gate electrode 152 and the source/drain 154 are formed of the same conductive material at the same time. As one example, the conductive material may include a metal material or an organic material. For example, the conductive material may include at least one of Al, Cu, Mo, W, Cr, Polyaniline (PANI), a conductive polymer (for example, PEDOT), a Carbon Nano Tube (CNT), Pyrrolidine, and graphite. As another example, the conductive material may include an organic matter and a semiconductive polymer material.

Moreover, a method of forming a self aligned field effect transistor structure according to an embodiment of the present invention will be described in more detail. Here, overlapping description related to the above-mentioned transistor may be omitted or simplified.

Figure 4:
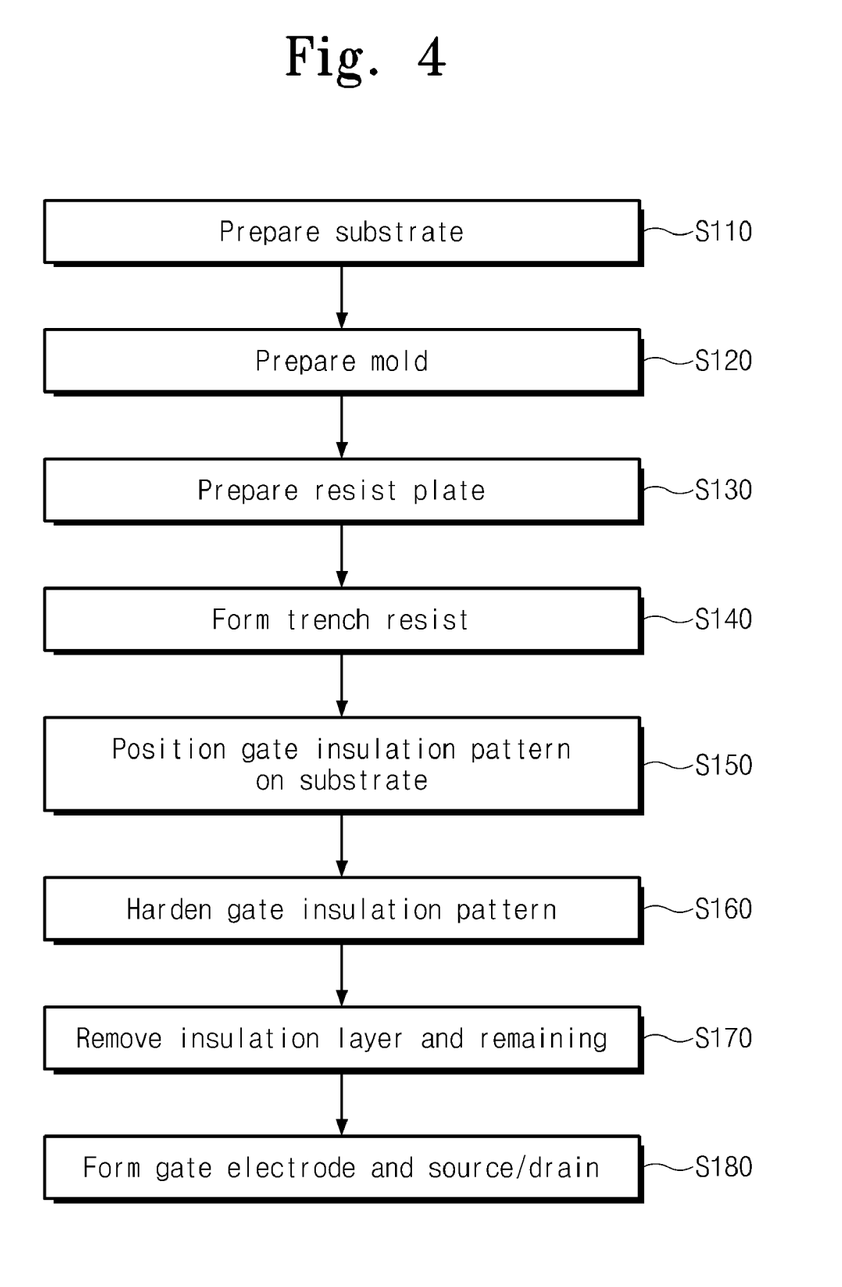
FIG. 4 is a flowchart illustrating a method of forming a self aligned field effect transistor structure according to an embodiment of the present invention.

FIG. 4 is a flowchart illustrating a method of forming a self aligned field effect transistor structure according to an embodiment of the present invention. FIGS. 5A through 5I are views illustrating a method of forming a self aligned field effect transistor structure according to an embodiment of the present invention.

Figure 5A:
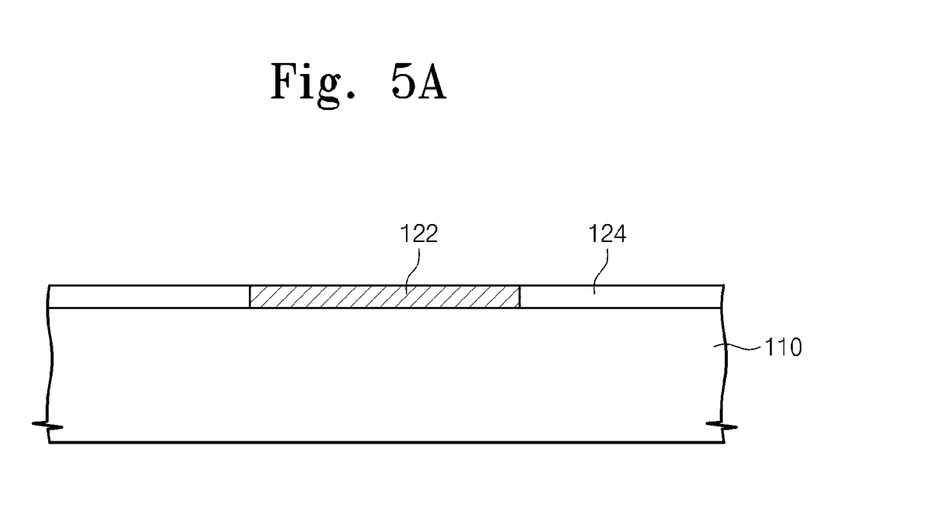
FIGS. 5A through 5I are views illustrating a method of forming a self aligned field effect transistor structure according to an embodiment of the present invention.

Referring to FIGS. 4 and 5A, a substrate 110 may be prepared in operation S110. As one example, the preparing of the substrate 110 may include preparing a transparent substrate. For example, the preparing of the substrate 110 may include a glass substrate for manufacturing a display device or a plastic substrate.

An active region 122 may be formed on the substrate 110. The forming of the active region 122 includes forming a channel formation layer on the substrate 110 and patterning the channel formation layer. The channel formation layer may include a polycrystalline silicon layer. Then, an isolation insulation layer 124 is formed. The forming of the isolation insulation layer 124 may include forming an insulation layer pattern on the substrate 110 to expose the top of the active region 122. At this point, the top of the isolation insulation layer 124 and the top of the active region 122 may be coplanar.

Figure 5B:
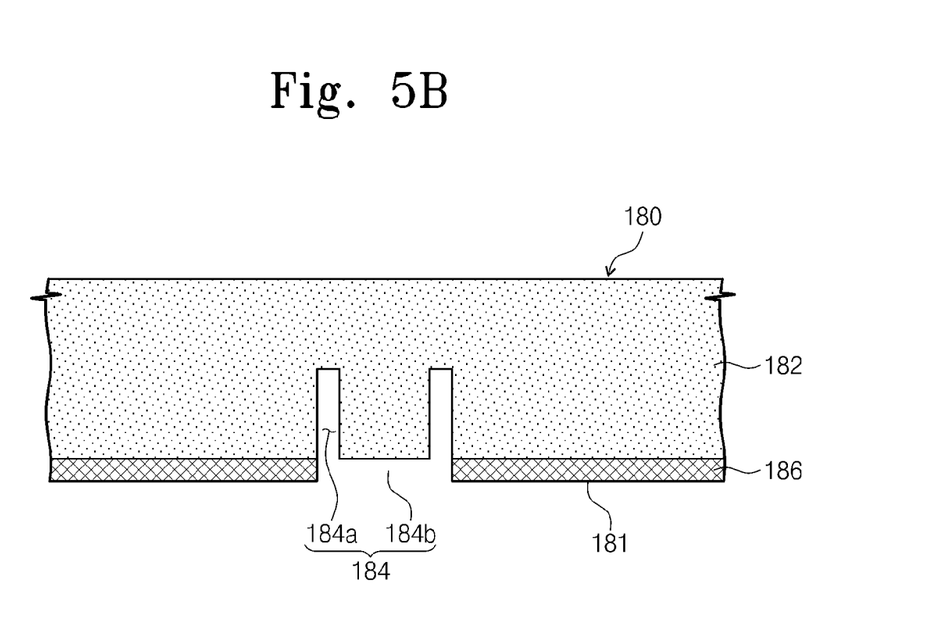

Referring to FIGS. 4 and 5B, a mold 180 is prepared in operation S120. As one example, the preparing of the mold 180 includes preparing a light transmission plate 182 having the front surface 181 where a groove 184 is formed. The light transmission plate 182 may be a transparent plate that transmits light. For example, the light transmission plate 182 may include quartz, glass, or a transparent organic matter (for example, Polydimethylsiloxane (PDMS) and Polyisoprene (PI)). The groove 184 may be for forming the U-shaped gate insulation pattern 142 described with reference to FIGS. 1 through 3. Accordingly, the groove 184 may have a form corresponding to the U-shaped gate insulation pattern 142. For example, the groove 184 includes a vertical groove 184a that vertically extends toward the inside of the light transmission plate 182 and a parallel groove 184b that horizontally connects the vertical grooves 184a at the front surface 181. A light blocking layer 186 is formed on the front surface 181 of the light transmission plate 182. The light blocking layer 186 may be formed being disposed on the same plane as the parallel groove 184b. Furthermore, the thickness of the light blocking layer 186 is identical to the depth of the parallel groove 184b. The light blocking layer 186 may be formed of material that can block the light. For example, the light blocking layer 186 may include a metal layer. More specifically, the light blocking layer 186 may be formed of at least one of Cr, Al, Ti, Ag, W, Ni, and Cu.

Figure 5C:
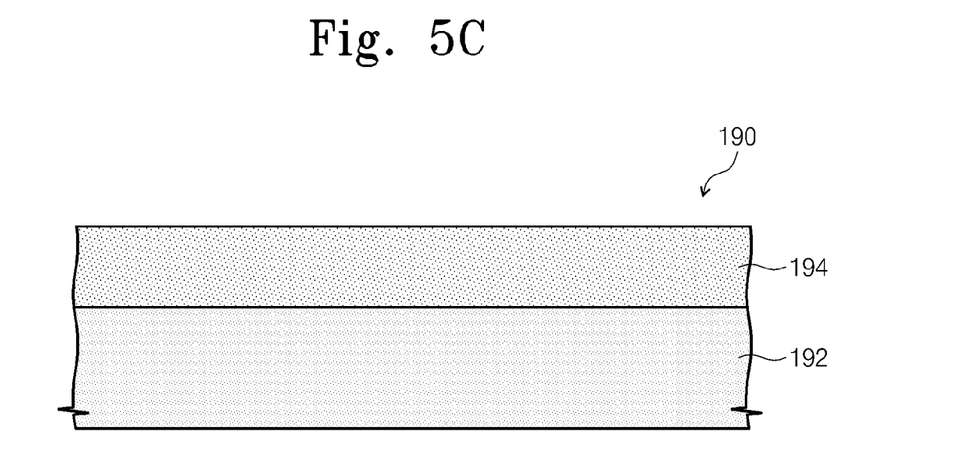

Referring to FIGS. 4 and 5C, a resist plate 190 is prepared in operation S130. The preparing of the resist plate 190 may include preparing a plate 192 having the front surface where a resist 194 is formed. The resist 194 may include material used for forming the gate insulation pattern 142 described with reference to FIGS. 1 through 3. As one example, the resist 194 may include a photo-setting photo initiator or a monomer. For example, the resist 194 may include an organic matter (such as Polyvinyl Pyrrolidone (PVP), Polymethyl-methacrylate (PMMA), Hydrogen SilsesQuioxane (HSQ)), or an oxide (such as aluminum oxide layer). Additionally, the resist 194 may include an inorganic matter (for example, a silicon oxide layer, a silicon nitride layer, and an aluminum nitride layer) and another organic matter (for example, polyimide and acrylic material).

Figure 5D:
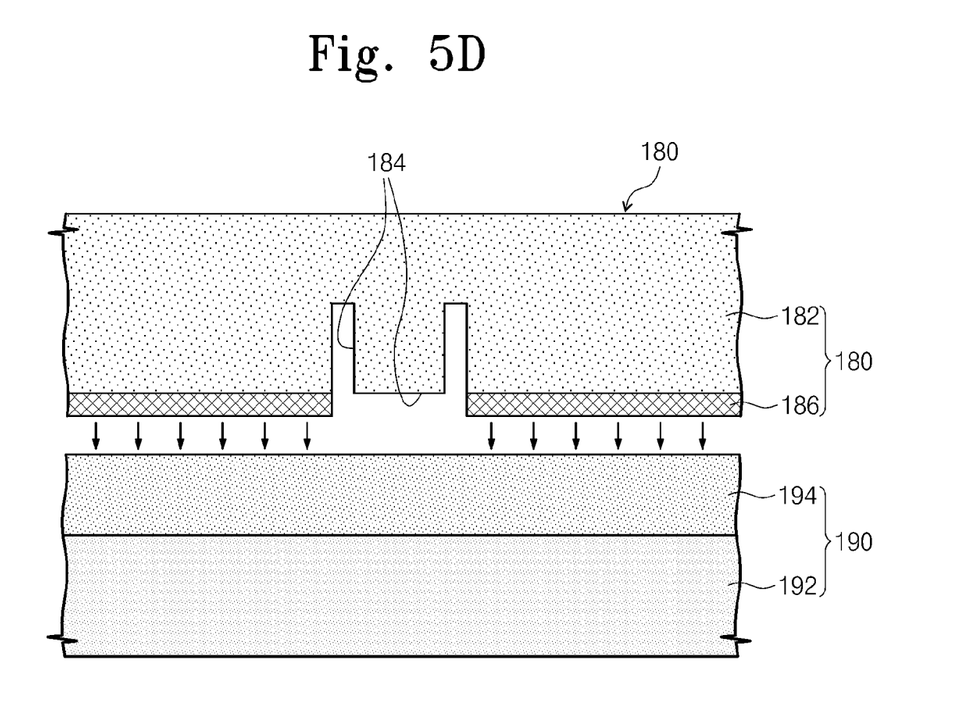
Figure 5E:
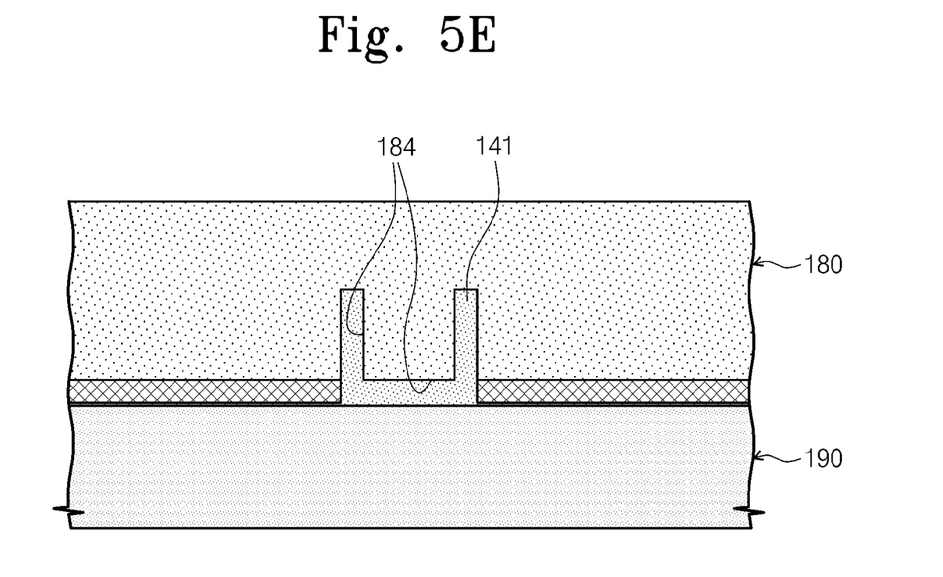

Referring to FIGS. 4, 5D, and 5E, a U-shaped resist 141 is formed in operation S140. The forming of the gate insulation pattern 142 includes performing an imprint process. The imprint process uses a mold and stamps a thin layer (which is formed in the mold) on a substrate. As one example, the forming of the gate insulation pattern 142 includes pressing the mold 180 on the resist plate 190. During the pressing of the mold 180 on the resist plate 190, the resist 194 on the plate 192 may be filled in the groove 184 of the light transmission plate 182. Accordingly, the U-shaped resist 141 may be formed in the mold 180.

In addition, during the performing of the imprint process, the mold 180 and the resist plate 190 may be additionally thermally treated. The thermally treating of the mold 180 and the resist plate 190 is for effectively filling the groove 184 with the resist 194.

Figure 5F:
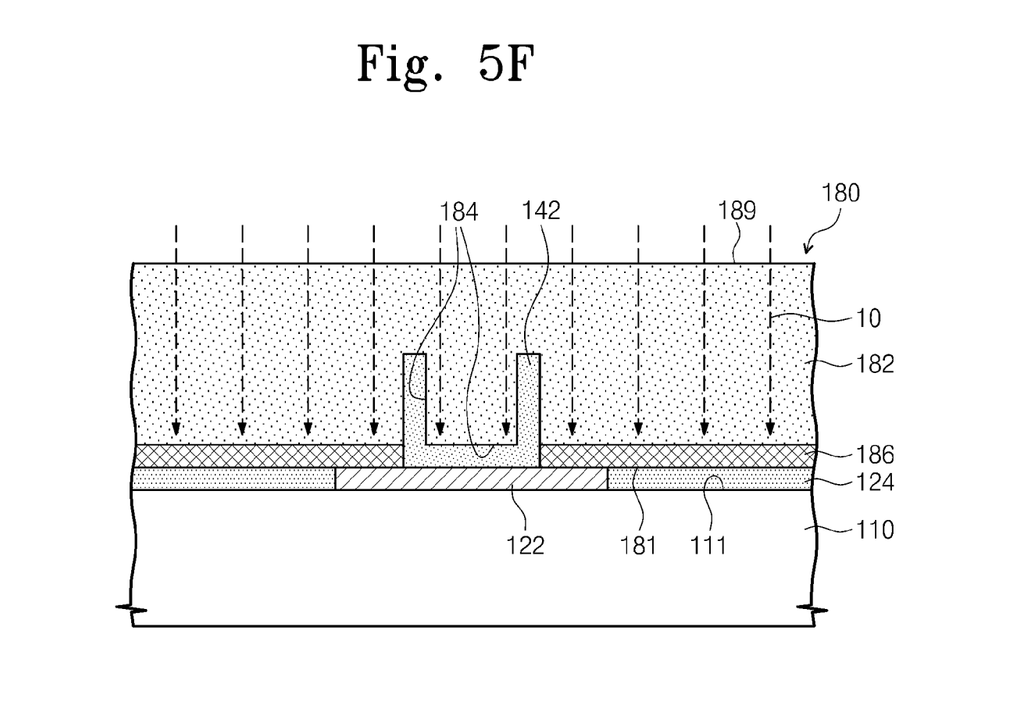

Referring to FIGS. 4 and 5F, the gate insulation pattern 142 may be positioned on the substrate 110 in operation S150. As one example, the mold 180 and the substrate 110 may be positioned in order to allow the front surface 181 of the mold 180 and the front surface 111 of the substrate 110 to face each other. The mold 180 adheres to the substrate 110. At this point, the isolation insulation layer 124 on the substrate 110 is used as a stopper in order to contact the mold 180 and the substrate 110. Additionally, in order to position the U-shaped resist 141 of FIG. 5E on the active region 122, the mold 180 and the substrate 110 can be aligned to each other. Additionally, the mold 180 is separated from the substrate 110 with leaving the U-shaped resist 141 on the active region 122. Accordingly, the sequentially-stacked active region 122 and gate insulation pattern 142 may be disposed on the substrate 110.

Moreover, the gate insulation pattern 142 is hardened in operation S160. The hardening of the gate insulation pattern 142 performs one of a light process and a heat process on the gate insulation pattern 142. As one example, the hardening of the gate insulation pattern 142 includes performing a light process on the gate insulation pattern 142. The performing of the light process on the gate insulation pattern 142 includes projecting light 10 toward the mold 180 when the mold 180 and the substrate 110 contact closely. Once the mold 180 contacts the substrate 110 closely, the light blocking layer 186 on the light transmission plate 182 may cover a region except for a region of the substrate 110 where the gate insulation pattern 142 is disposed. However, the gate insulation pattern 142 may be selectively exposed to the light transmission plate 182. The light 10 may be projected from the rear surface 189 of the mold 180 toward the front surface 181. Accordingly, after the light 10 projected toward the mold 180 is transmitted through the light transmission plate 182, it may selectively harden the exposed gate insulation pattern 142. However, the light 10 is prevented from being projected on the substrate 110 by the light blocking layer 186. Accordingly, the active region 122 and the isolation insulation layer 124 are not processed by the light 10, and thus may not be hardened. When the mold 180 contacts the substrate 110, a resist remaining (not shown) on the front surface 181 of the mold 180 may remain on the substrate 110. The resist remaining is not projected by the light 10 due to the light blocking layer 186, and may not be hardened.

Figure 5G:
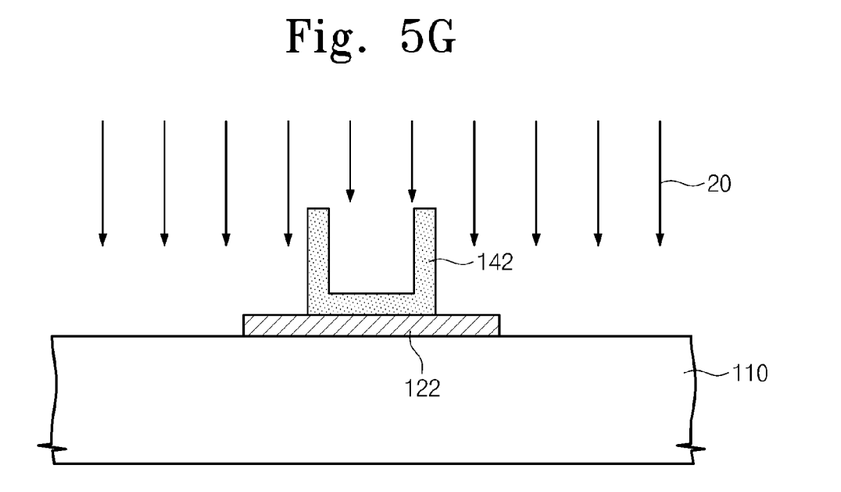

Referring to FIGS. 4 and 5G, the insulation layer 124 of FIG. 5F and the resist remaining (not shown) are removed in operation S170. As mentioned above, the resist remaining may remain on the substrate 110. The resist remaining may serve as a factor for increasing a contact resistance of the source/drain 154 of FIG. 5I that will be formed during a following process. Accordingly, a process for removing the resist remaining may be performed. As one example, the removing of the insulation layer 124 and the resist remaining may include performing a developing solution process on the substrate 110. For example, the developing solution process can be performed through a wet cleansing process that supplies various kinds of chemicals 20 to the substrate 110. At this point, the chemicals 20 may use liquid that has a faster etch rate with respect to the insulation layer 124 and the resist remaining compared to the gate insulation pattern 142. As mentioned above, during the performing of the light process on the gate insulation patterns 142, light treatment is not performed on the insulation layer 124 and the resist remaining (not shown) on the substrate 110. Accordingly, during the performing of the developing solution process on the substrate 110, the chemicals 20 selectively etch the insulation layer 124 and the resist remaining and may not etch the gate insulation pattern 142.

Figure 5H:
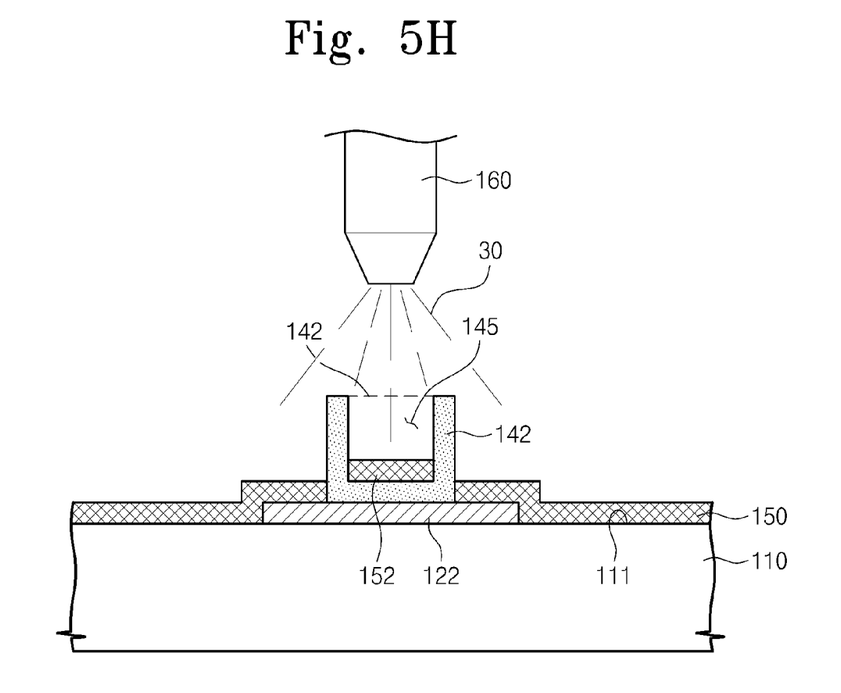
Figure 5I:
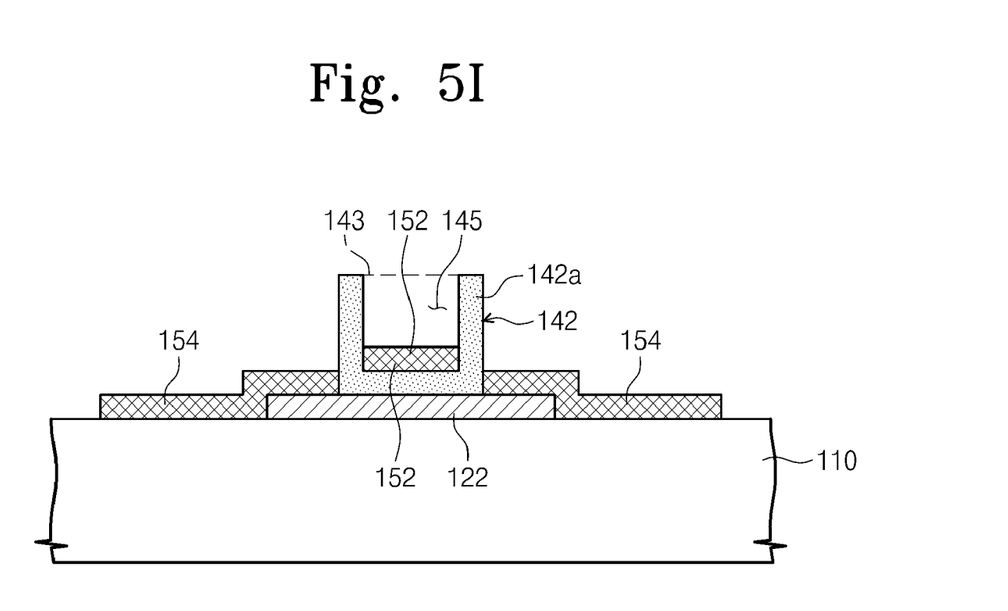

Referring to FIGS. 4, 5H, and 5I, the gate electrode 152 and the source/drain 154 are formed in operation S180. For example, the forming of the gate electrode 152 and the source/drain 154 includes supplying a conductive material 30 on the substrate 110. As one example, the supplying of the conductive material 30 includes supplying at least one of Al, Cu, Mo, W, Cr, Pt, PANI, a conductive polymer (for example, PEDOT), a CNT, Pyrrolidine, and graphite to the substrate 110. As another example, the supplying of the conductive material 30 includes supplying an organic matter or a semi-conductive polymer material.

The supplying of the conductive material 30 is completed using a distributor 160. As one example, the distributor 160 supplies a liquid conductive material 30 of a predetermined amount on the substrate 110 several times. As another example, the distributor 160 may include a spray that injects the conductive material 30 on the front surface 111 of the substrate 110. A portion of the conductive material 30 supplied to the substrate 110 by the distributor 160 is supplied to an inner space 145 through the open top 143 of the gate insulation pattern 142. The conductive material 30 flowing into the inner space 143 is self-aligned by the gate insulation pattern 142 and thus become a gate electrode 152. Additionally, a portion of the conductive material 30 is supplied into the external of the gate insulation pattern 142 and then becomes a conductive layer 150 on the substrate 110. Moreover, the source/drain 154 may be formed adjacent to the gate insulation pattern 142 by patterning the conductive layer 150. Therefore, the gate electrode 152 and the source/drain 154 are self-aligned by the gate insulation pattern 142.

Moreover, the supply amount of the conductive material 30 is controlled to prevent the conductive material 30 from overflowing from the inner space 145 of the gate insulation pattern 142. This is for electrically disconnecting the gate electrode 152 and the source/drain 154. For this, the height of the gate insulation pattern 142 is greater than the predetermined thickness of the gate electrode 152 and the source/drain 154.

As mentioned above, the self aligned field effect transistor structure 100 according to an embodiment of the present invention may include the U-shaped gate insulation pattern 142 and the gate electrode 152 and source/drain 154 (which are self-aligned by the gate insulation pattern 142). The gate electrode 152 and the source/drain 154 are simultaneously formed through an imprint method, such that formation processes of the self aligned field effect transistor structure 100 can be simplified.

Additionally, the self aligned field effect transistor structure 100 does not have resist remaining between the substrate 110 and the source/drain 154. Accordingly, the self aligned field effect transistor structure 100 reduces a contact resistance between the substrate 110 and the source/drain 154, such that its function as a switching device can be improved.

Figure 6:
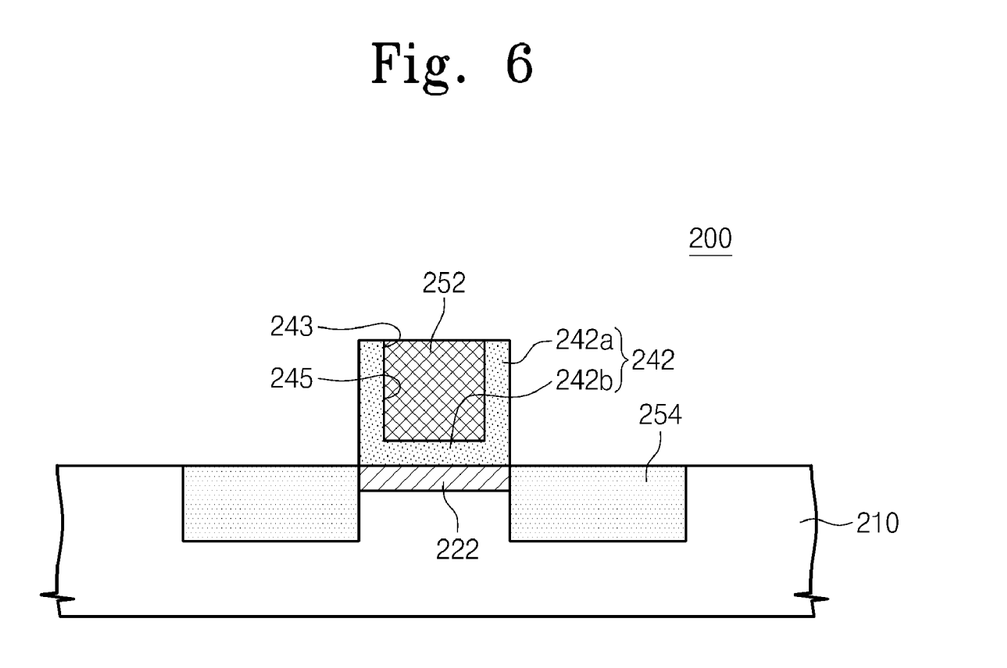
FIG. 6 is a sectional view illustrating a self aligned field effect transistor structure according another embodiment of the present invention.

Hereinafter, a self aligned field effect transistor structure according to another embodiment of the present invention will be described in more detail. FIG. 6 is a view illustrating a self aligned field effect transistor structure according another embodiment of the present invention.

Referring to FIG. 6, the self aligned field effect transistor structure 200 includes an ion implanted active region 222 for threshold voltage adjustment and a gate insulation pattern 242, which are sequentially-stacked on the substrate 210. Additionally, the transistor 200 further includes a gate electrode 252 and a source/drain 254.

The substrate 210 may be one of a semiconductor substrate, a transparent substrate, and a plastic substrate. As one example, the substrate 210 may be a wafer for manufacturing a semiconductor integrated circuit. The substrate 210 may be a single crystal bulk silicon substrate. Additionally, the substrate 210 may be a P-type semiconductor substrate where P-type impurity such as B is implanted.

The active region 222 may be interposed between the substrate 210 and the gate electrode 252. The active region 222 may include a conductive material used for forming a channel. For example, the active region 222 includes poly-silicon.

The gate insulation pattern 242 may have a section of a U-shape. As one example, the gate insulation pattern 242 includes a sidewall 242a that is vertically disposed and a bottom wall 242b. The sidewall 242a and the bottom wall 242b typically have a section of a U-shape with an opened top 243. The gate insulation pattern 242 may be formed of an insulating material. For example, the gate insulation pattern 242 may include a silicon oxide layer.

The gate electrode 252 may be disposed in an inner space 245 of the gate insulation pattern 242. As one example, the side and bottom of the gate electrode 252 may be disposed being surrounded by the gate insulation pattern 242. The source/drain 254 may be disposed in the substrate 110 at the external of the gate electrode 252.

Figure 7:
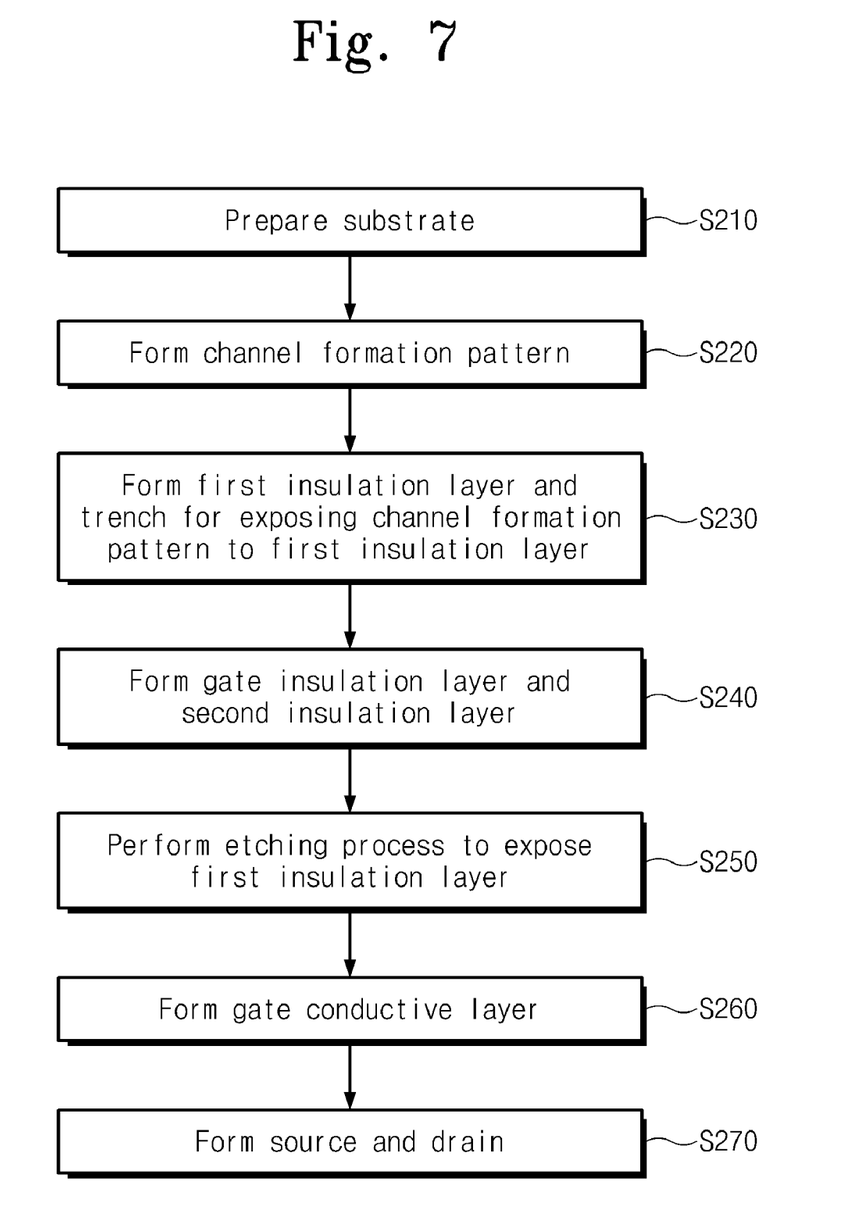
FIG. 7 is a flowchart illustrating a method of forming a transistor according to another embodiment of the present invention.

Furthermore, a method of forming a self aligned field effect transistor structure according to another embodiment of the present invention will be described in more detail. FIG. 7 is a flowchart illustrating a method of forming a transistor according to another embodiment of the present invention. FIGS. 8A through 8D are views illustrating formation processes of a transistor according to another embodiment of the present invention.

Figure 8A:
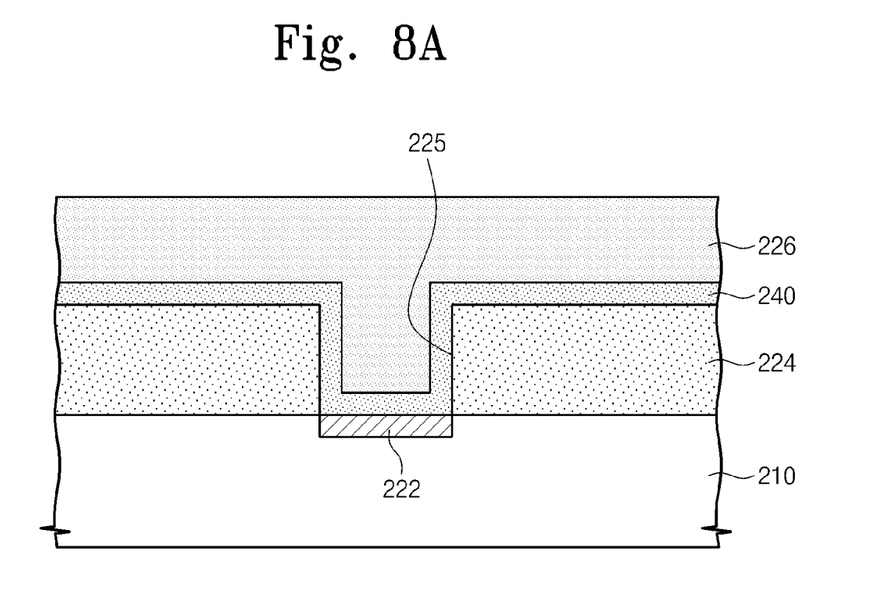
FIGS. 8A through 8D are views illustrating formation processes of a transistor according to another embodiment of the present invention.

Referring to FIGS. 7 and 8A, a substrate 210 is prepared in operation S210. As one example, the preparing of the substrate 110 may include preparing a substrate for manufacturing a semiconductor integrated circuit chip (for example, a wafer).

An active region 222 is formed in the substrate 210 in operation S220. As one example, the forming of the active region 222 includes forming a polysilicon layer on the substrate 210 and patterning the polysilicon layer. For example, the forming of the polysilicon layer may include performing a chemical vapor deposition (CVD) process. As another example, the forming of the active region 222 may include doping the substrate 210 with an impurity ion.

The forming of the first insulation layer (hereinafter, an isolation insulation layer 224) and the forming of a trench 225 in the isolation insulation layer 224 to expose the active region 222 may be sequentially performed in operation S230. Additionally, the conformally forming of a gate insulation layer 240 to cover the result having the trench 225 and the forming of a second insulation layer 226 are sequentially performed in operation S240. The gate insulation layer 240 may be formed through a thermal oxide process or a CVD process. The gate insulation layer 240 may include one of a silicon oxide layer, a hafnium oxide layer, a hafnium silicate layer, a zirconium oxide layer, a zirconium silicate layer, an aluminum oxide layer, and an aluminum silicate layer. The forming of the second insulation layer 226 may include forming a layer on the substrate 210, which has an etch selectivity with respect to the isolation insulation layer 224.

Figure 8B:
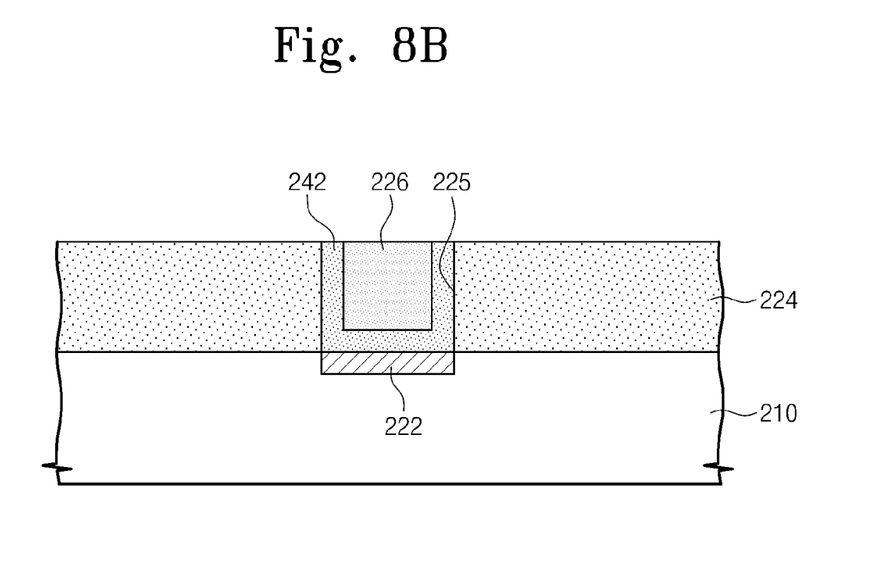

Referring to FIGS. 7 and 8B, an etching process is performed to expose the isolation insulation layer 224 in operation S250. The performing of the etching process may include performing a planarization process and an etch back process using the isolation insulation layer 224 as an etching stop layer. Accordingly, the active region 222 and the gate insulation pattern 242 are sequentially stacked on the substrate 110.

Figure 8C:
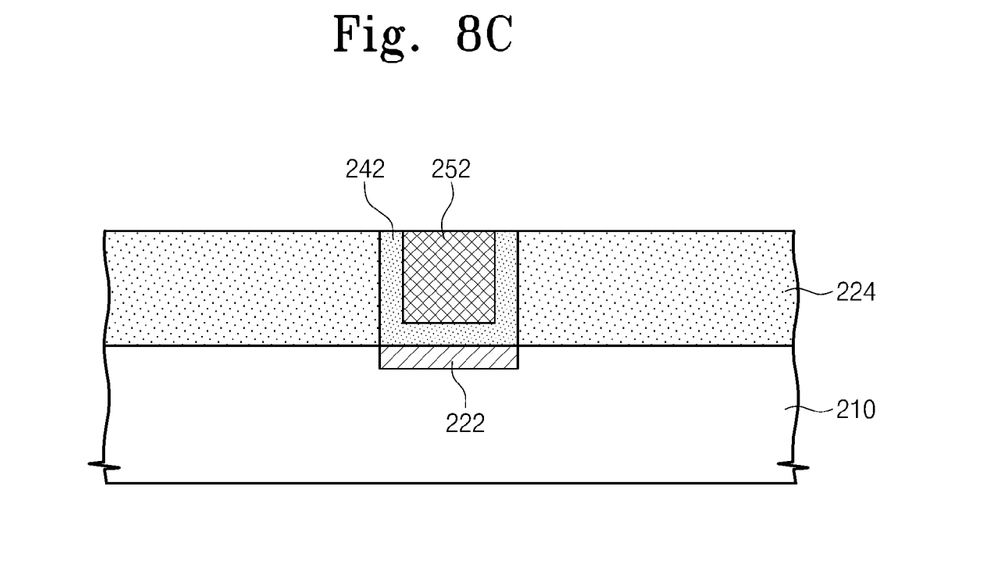

Referring to FIGS. 7 and 8C, the second insulation layer 226 in the gate insulation pattern 242 is removed. The removing of the second insulation layer 226 may include performing an etching process of a etch recipe having a slower etch rate with respect to the isolation insulation layer 224 and the gate insulation pattern 242 compared to the second insulation layer 226.

The gate electrode 252 is formed in operation S260. The forming of the gate electrode 252 includes forming a conductive layer on the front surface 211 of the substrate 210 having an isolation insulation layer 224 and performing an etching process to expose the isolation insulation layer 224. The etching process may include a planarization process or an etch back process using the isolation insulation layer 224 as an etch stop layer. Accordingly, the sidewall and the bottom wall of the gate electrode 252 surrounded by the gate insulation pattern 242 may be formed on the substrate 110.

Figure 8D:
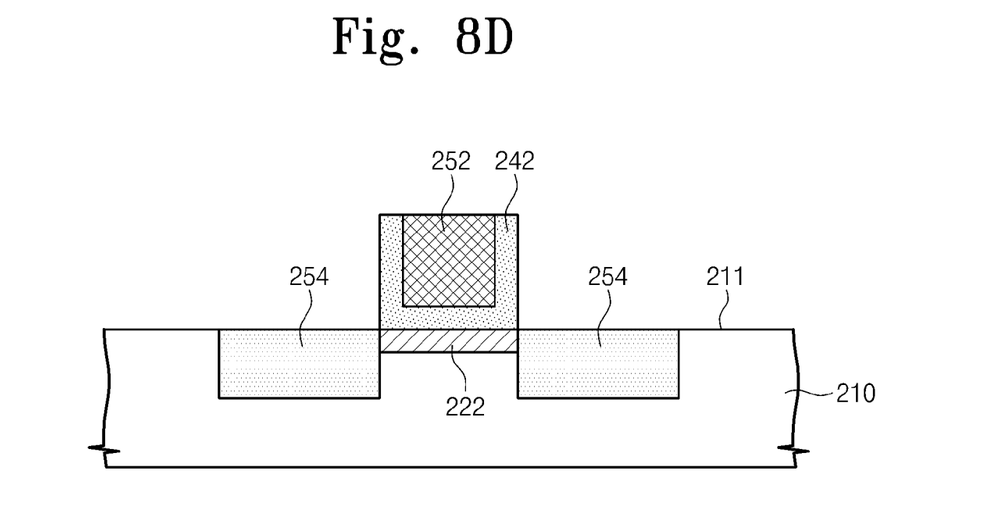

Referring to FIGS. 7 and 8D, the isolation insulation layer 224 of FIG. 8C is removed and a source/drain 254 is formed in operation S270. The forming of the source/drain 254 includes performing an ion implantation process on the front surface 211 of the substrate 210. The performing of the ion implantation process may include implanting an impurity ion on the substrate 110 adjacent to the gate insulation pattern 242. Accordingly, the source/drain 254 is self-aligned by the gate insulation pattern 242 and the gate electrode 252. Before the forming of the source/drain 254, a spacer (not shown) covering the sidewall of the gate insulation pattern 242 is formed.

In the self aligned field effect transistor structure according to the present invention, resist remaining does not remain between a substrate and a source/drain. Accordingly, the self aligned field effect transistor structure can improve an operation speed because a contact resistance of a source/drain is low.

The self aligned field effect transistor structure according to the present invention includes a self-aligned gate electrode and source/drain because of a gate insulation pattern. Accordingly, manufacturing processes of the self aligned field effect transistor structure can be simplified.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A self aligned field effect transistor structure comprising:
an active region on a substrate;
a U-shaped gate insulation pattern on the active region;

a gate electrode self-aligned by the gate insulation pattern and disposed in an inner space of the gate insulation pattern; and a source region and a drain region self-aligned by the gate insulation pattern and disposed on the substrate adjacent to the gate insulation pattern, wherein the gate insulation pattern exposes an entire top surface of the source and drain regions, and wherein the substrate comprises a glass substrate, and the self aligned field effect transistor structure comprises a switching device of a display device.

2. The self aligned field effect transistor structure of claim 1, wherein:

the gate insulation pattern comprises a sidewall and a bottom wall; and a height of the sidewall is higher than a top height of the gate electrode.

3. The self aligned field effect transistor structure of claim 1, wherein the gate electrode is formed by supplying a conductive material to the inner space through a open top of the U-shaped gate insulation pattern.

4. The self aligned field effect transistor structure of claim 1, wherein the source and drain regions are formed by implanting an impurity ion on the substrate.

5. The self aligned field effect transistor structure of claim 1, wherein the source and drain regions are formed by supplying a conductive material on the substrate.

6. The self aligned field effect transistor structure of claim 5, wherein the gate electrode and the source and drain regions are formed of the same conductive material.

7. The self aligned field effect transistor structure of claim 5, wherein the gate electrode and the source and drain regions comprise at least one of Al, Cu, Mo, W, Cr, Pt, Polyaniline (PANI), a conductive polymer such as PEDOT, a Carbon Nano Tube (CNT), Pyrrolidine, and graphite.

8. The self aligned field effect transistor structure of claim 1, wherein a width of the active region is greater than a bottom width of the gate insulation pattern.

9. The self aligned field effect transistor structure of claim 1, wherein a width of the active region is greater than a distance between the source region and the drain region.

10. The self aligned field effect transistor structure of claim 1, wherein a width of the gate insulation pattern is the same as a distance between the source region and the drain region.

11. The self aligned field effect transistor structure of claim 1, wherein the gate insulation pattern comprises a bottom wall and two sidewalls, and each sidewall extends upward from the bottom wall, and each sidewall ends at the highest point thereof without further extending in a horizontal direction.

12. The self aligned field effect transistor structure of claim 11, wherein each sidewall of the gate insulation pattern extends gradually upward from the bottom wall to the highest point thereof.

13. The self aligned field effect transistor structure of claim 11, wherein a width of the gate insulation pattern is defined by a distance from an outside surface of one sidewall to an outside surface of the other sidewall.

* * * * *